United States Patent
Tseng et al.

(10) Patent No.: US 7,919,406 B2
(45) Date of Patent: Apr. 5, 2011

(54) STRUCTURE AND METHOD FOR FORMING PILLAR BUMP STRUCTURE HAVING SIDEWALL PROTECTION

(75) Inventors: Ming Hung Tseng, Toufen Township (TW); Young-Chang Lien, Taipei (TW); Chen-Shien Chen, Zhubei (TW); Chen-Cheng Kuo, Chu-Pei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/791,127

(22) Filed: Jun. 1, 2010

(65) Prior Publication Data

US 2011/0006416 A1    Jan. 13, 2011

Related U.S. Application Data

(60) Provisional application No. 61/223,877, filed on Jul. 8, 2009.

(51) Int. Cl.
*H01L 21/44* (2006.01)

(52) U.S. Cl. ......... 438/613; 257/737; 438/612; 438/614

(58) Field of Classification Search .................. 257/737; 438/612–614
See application file for complete search history.

(56) References Cited

U.S. PATENT DOCUMENTS 7,391,112 B2    6/2008   Li et al.

*Primary Examiner* — Thanh V Pham
*Assistant Examiner* — Marvin Payen
(74) *Attorney, Agent, or Firm* — Lowe Hauptman Ham & Berner, LLP

(57) ABSTRACT

A method for forming a metal pillar bump structure is provided. In one embodiment, a passivation layer is formed over a semiconductor substrate and a conductive layer is formed over the passivation layer. A patterned and etched photoresist layer is provided above the conductive layer, the photoresist layer defining at least one opening therein. A metal layer is deposited in the at least one opening. Portions of the photoresist layer are etched along one or more interfaces between the photoresist layer and the metal layer to form cavities. A solder material is deposited in the at least one opening, the solder material filling the cavities and a portion of the opening above the metal layer. The remaining photoresist layer and the conductive layer not formed under the copper layer are removed. The solder material is then reflown to encapsulate the metal layer.

11 Claims, 2 Drawing Sheets

STRUCTURE AND METHOD FOR FORMING PILLAR BUMP STRUCTURE HAVING SIDEWALL PROTECTION

CROSS-REFERENCE TO RELATED APPLICATIONS

The present application claims priority of U.S. Provisional Patent Application Ser. No. 61/223,877, filed on Jul. 8, 2009, which is incorporated herein by reference in its entirety.

TECHNICAL FIELD

The present disclosure relates generally to flip chip and wafer-level packaging, and more particularly, to a structure and method for forming metal pillar bump structures having sidewall protection.

BACKGROUND

Copper pillar bumps were introduced in 2006 by Intel in their 65-nm "Yonah" microprocessor. As pin counts and interconnect densities increase, interest grew in copper pillar bumps as an alternative to conventional solder bumps for flip chip and wafer-level packaging.

Copper pillars offer advantages over solder bumps such as higher interconnect densities, higher reliability, improved electrical and thermal performance, and reduction or elimination of lead. While solder bumps collapse during solder reflow, copper pillars retain their shape in the x, y, and z directions. This allows for fabrication of finer bump pitches, smaller passivation openings, and fine redistribution wiring for higher interconnect densities.

However, during the manufacturing process the sidewalls of the copper pillar may be prone to chemical degradation during an etching process and at a subsequent assembly joining process oxidation may form on the copper pillar sidewalls resulting in poor pillar reliability and poor adhesion of copper to an underfill material.

For these reasons and other reasons that will become apparent upon reading the following detailed description, there is a need for an improved copper pillar bump in flip chip and wafer-level packaging that avoids the reliability concerns associated with conventional copper pillar bumps.

BRIEF DESCRIPTION OF DRAWINGS

The features, aspects, and advantages of the present disclosure will become more fully apparent from the following detailed description, appended claims, and accompanying drawings in which:

DETAILED DESCRIPTION

In the following description, numerous specific details are set forth to provide a thorough understanding of the embodiments of the present invention. However, one having an ordinary skill in the art will recognize that the embodiments of the invention can be practiced without these specific details. In some instances, well-known structures and processes have not been described in detail to avoid unnecessarily obscuring the embodiments of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-4 are simplified exemplary cross-sectional views of a semiconductor device at various stages of forming a metal bump structure, according to embodiments of the present invention. These diagrams are merely examples, and are not intended to restrict the invention to only what is illustrated. One of ordinary skill in the art would recognize other variations, modifications, and alternatives.

Figure 1:
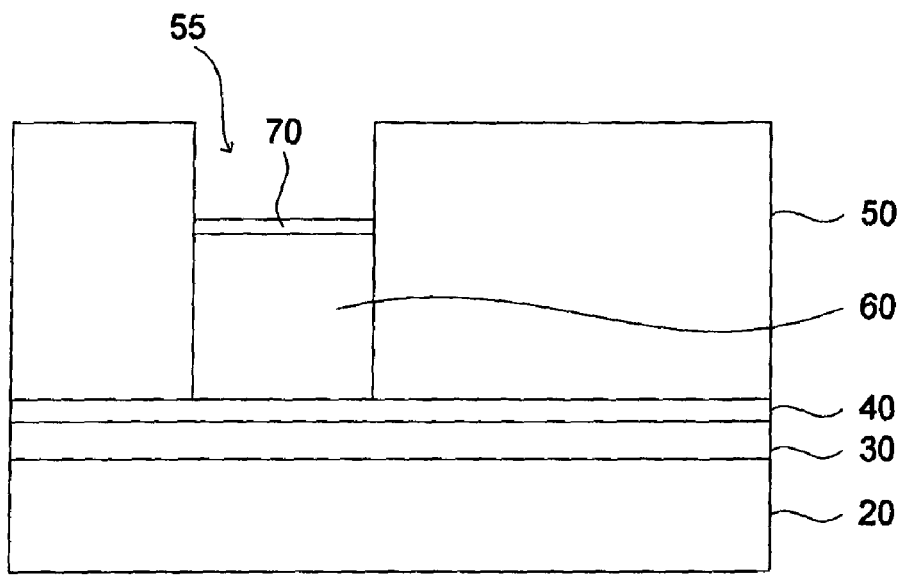
FIGS. 1-4 are cross-sectional views of a semiconductor device at various stages of forming a copper pillar bump structure, according to embodiments of the present invention.

FIG. 1 shows a semiconductor substrate 20 according to an exemplary embodiment of the present invention. The substrate 20 may be a semiconductor process wafer (e.g., a 200 mm, 300 mm, 400 mm, etc. silicon wafer) and may include therein metal layers, insulating layers, device components, etc., formed in earlier processes. The substrate 20 may be a single crystalline or polycrystalline silicon substrate. It will be appreciated that the substrate 20 may include an epi silicon layer, buried layers, silicon on insulator (SOI), SiGe, or GaAs.

A passivation layer 30 is thereafter formed over substrate 20. The passivation layer 30 may be one or more layers and comprise a material, such as an oxide, undoped silicate glass (USG), silicon nitride (SiN), silicon dioxide ($SiO_2$), silicon oxynitride (SiON), or polyimide. Although not shown in FIG. 1, it is understood by those skilled in the art that the passivation layer 30 may contain therein conductive layers such as contact pads and metal lines to make electrical contact with an overlying copper pillar bump, for example. The passivation layer 30 may be deposited over the substrate 20 by deposition techniques, such as chemical vapor deposition (CVD) techniques and spin-on glass (SOG) techniques. CVD methods may include low pressure CVD (LPCVD), plasma enhanced CVD (PECVD), or atmospheric pressure CVD (APCVD) methods. In one embodiment of the present invention, the passivation layer 30 comprises an oxide and a nitride and is deposited to a thickness of from about 2,000 Angstroms to about 12,000 Angstroms. In another embodiment, the passivation layer 30 has a thickness of from about 2,000 Angstroms to about 6,000 Angstroms.

A conductive layer, or seed layer 40 is thereafter formed over the passivation layer 30 to prevent metal diffusion. The seed layer 40 may comprise of titanium or copper, for example and be formed by techniques such as sputtering, evaporation, or other deposition techniques. In one embodiment, the seed layer 40 is deposited to a thickness of from about 1,000 Angstroms to about 8,000 Angstroms.

Still referring to FIG. 1, a photoresist layer 50 is formed over the seed layer 40. The photoresist layer 50 acts as a mold for a metal deposition process, such as copper electroplating in the formation of a copper pillar bump. One skilled in the art understands that the photoresist material is one that is capable of coating, exposing, developing, electroplating, and stripping with equipment and ancillary process chemicals. In one embodiment of the present invention, the photoresist layer 50 comprises a chemically amplified, positive photoresist with high contrast and resolution having a thickness of from about 60 μm to about 120 μm. The photoresist layer 50 is thereafter patterned by a photolithographic patterning process and developed to form one or more openings 55.

A metal layer, or copper layer 60 is thereafter deposited in opening 55 of the photoresist layer 50. The copper layer 60 may also include copper alloys. Metals or alloys with good thermal conductivity such as gold (Au), silver (Ag), aluminum (Al), Sn—Ag, and Sn—Cu are also alternate materials. The copper layer 60 may be deposited in the opening 55 by a copper electroplating process or by electroless plating. In one embodiment, the copper layer 60 is deposited on substrate 20 to a thickness of from about 40 μm to about 80 μm. According to one embodiment using an electroplating process, the opening 55 of the photoresist layer 50 is electroplated with either copper or other copper alloys to form a first layer of electroplated copper pillar. Additional layers may then be formed. Prior to performing the electroplating process, removing oil, grease, oxide and other contaminant with 3-5 dilute $H_2SO_4$ solution for about 3 minutes from the substrate 20 could ensure getting better bonding adhesion between the substrate 20 and the electroplated layer of copper pillar, according to one embodiment of the present invention. In another embodiment, an optimal electric current density for copper electroplating is 3-7 ASD ($A/dm^2$) and any electric current type may be used. In this case, the electroplating deposition rate reaches 0.3 μm/min in 0.5 ASD, and this may be almost proportional to the electric current density.

Following the formation of the copper pillar, an optional metal barrier layer, or nickel layer 70 may be formed on the surface of the copper layer 60. The nickel layer 70 prevents copper from diffusing into a later-to-be-formed solder material.

Figure 2:
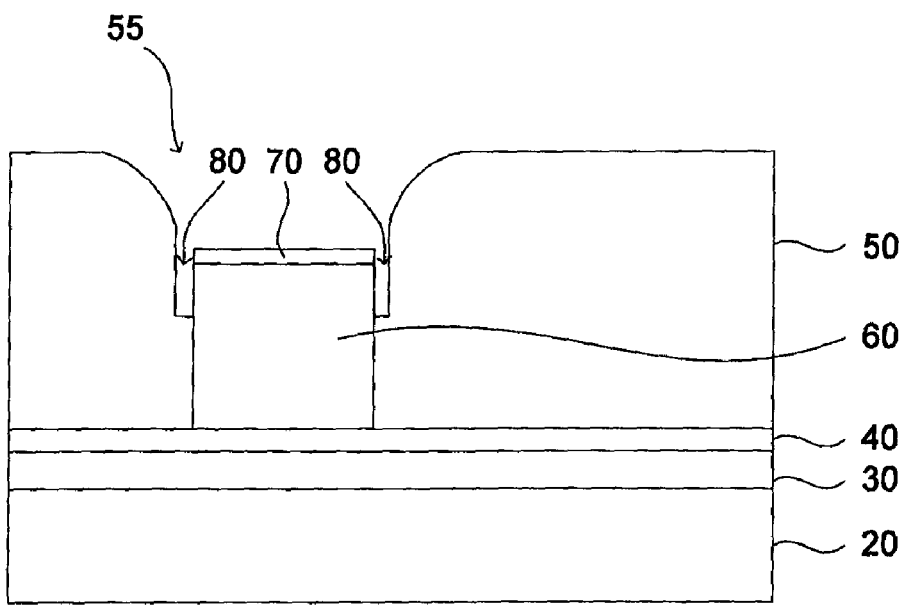

With reference now to FIG. 2, portions of the photoresist layer 50 along one or more interfaces between the photoresist layer 50 and the copper layer 60 are etched away to form cavities 80. The photoresist layer 50 may be etched by etching processes, such as plasma etch or resist strip employing etching chemicals and other process parameters. According to one embodiment, the photoresist layer 50 is etched under condition of a gas comprising $CF_4$, Argon, $O_2$, $N_2$, or $CHF_3$, between a temperature range of from about 50° C. to about 150° C., applying a power of from about 800 W to about 1,000 W, and for a time from about 40 seconds to 1 minute.

Figure 3:
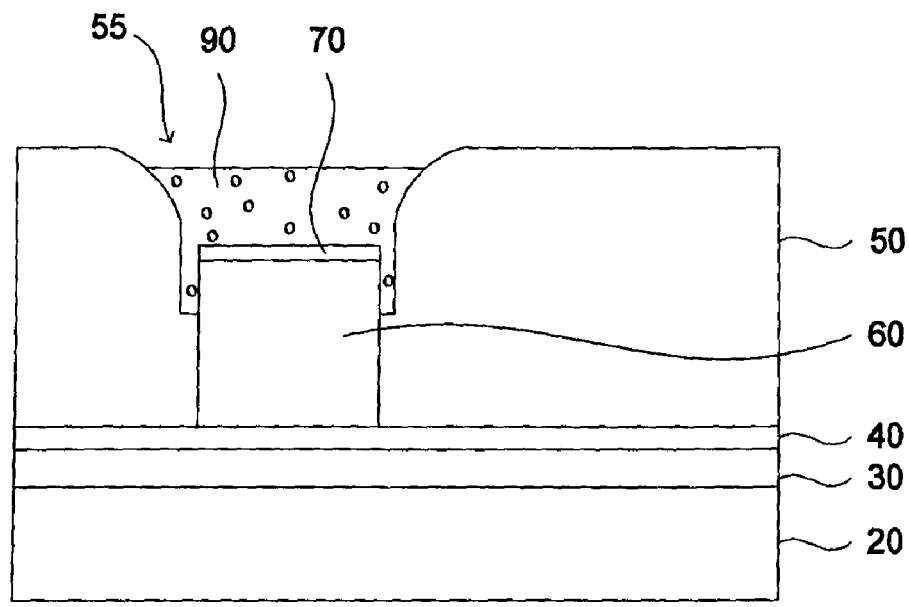
Figure 4:
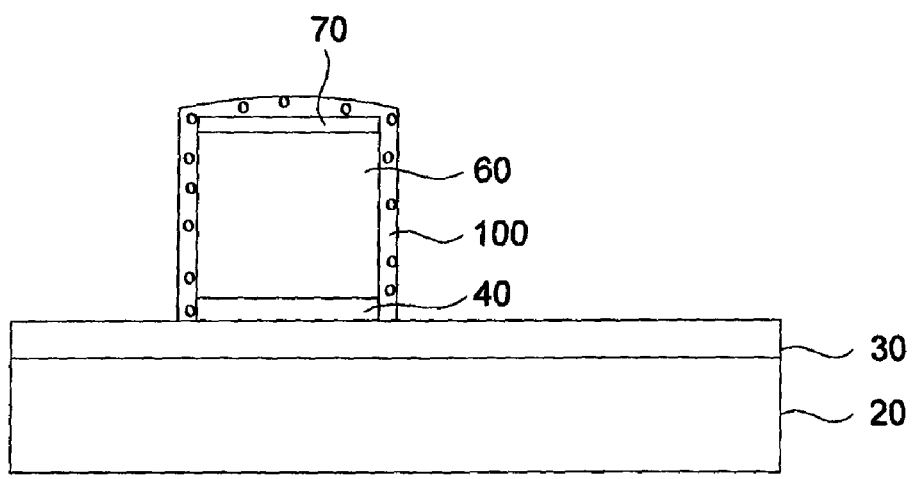

As shown in FIG. 3, a solder material 90 is deposited in opening 55, the solder material 90 filling the cavities 80 and a portion of the opening 55 above the copper layer 60. According to one embodiment, the solder material 90 is a lead-free solder material. According to some embodiments, the solder material 90 is made from a solder paste containing a low percent of lead (Pb). The solder material 90 has a melting point lower than that of the metal pillar bump. Following the deposition of the solder material 90, the remaining photoresist layer 50 is thereafter removed by a conventional ashing and/or wet stripping process. The solder material 90 is then reflown to encapsulate the copper layer 60. The reflow process may soften and/or melt the solder material 90 but not the copper layer 60 such that the solder material 90 may flow along the top and sidewalls of the copper layer 60, or the copper pillar bump so as to encapsulate the copper pillar bump. The encapsulation solder material may be substantially conformal on the sidewalls of the copper pillar bump. In some embodiments, the reflow process may heat the solder material between about 180° C. and about 320° C. for a processing time of from about 10 seconds to about 180 seconds. Other process temperatures and/or processing times of the reflow process may be used in other exemplary embodiments.

The methods of forming metal pillar bump structures having sidewall protection according to embodiments of the present invention may be employed in a wide range of applications where it is desired to form interconnects in flip chip and wafer-level packaging. The method is particularly advantageous for protecting the sidewalls of the metal pillar bumps during the manufacturing process because the sidewalls of the pillar may be degraded by chemicals during an etching process or oxidation may form on the sidewalls of the pillar bump resulting in poor device performance.

In the preceding detailed description, the disclosure was described with reference to exemplary embodiments thereof. It will, however, be evident that various modifications, structures, processes, and changes may be made thereto without departing from the broader spirit and scope of embodiments as set forth in the claims. The specification and drawings are, accordingly, to be regarded as illustrative and not restrictive. It is understood that embodiments are capable of using various other combinations and environments and are capable of changes or modifications within the scope of the inventive concept as expressed herein.

What is claimed is:

1. A method for forming a metal pillar bump structure, comprising:
    forming a passivation layer over a semiconductor substrate;
    forming a conductive layer over the passivation layer;
    providing a patterned and etched photoresist layer above the conductive layer, the photoresist layer defining at least one opening therein;
    depositing a metal layer in the at least one opening;
    etching portions of the photoresist layer along one or more interfaces between the photoresist layer and the metal layer to form cavities;
    depositing a solder material in the at least one opening, the solder material filling the cavities and a portion of the opening above the metal layer;
    removing the remaining photoresist layer and the conductive layer not formed under the metal layer; and
    reflowing the solder material to encapsulate the metal layer.

2. The method of claim 1, wherein the passivation layer is a material selected from the group consisting of an oxide, undoped silicate glass (USG), a polyimide, a silicon nitride (SiN), a silicon dioxide ($SiO_2$), and a silicon oxynitride (SiON).

3. The method of claim 1, wherein the passivation layer comprises an oxide and a nitride and has a thickness of from about 2,000 Angstroms to about 12,000 Angstroms.

4. The method of claim 1, wherein the conductive layer comprises titanium or copper.

5. The method of claim 1, wherein the conductive layer has a thickness of from about 1,000 Angstroms to about 8,000 Angstroms.

6. The method of claim 1, wherein the metal layer comprises copper or a copper alloy.

7. The method of claim 1, wherein the metal layer has a thickness of from about 40 μm to about 80 μm.

8. The method of claim 1, further comprising forming a metal barrier layer over the metal layer.

9. The method of claim 8, wherein the metal barrier layer comprises nickel.

10. The method of claim 1, wherein the photoresist layer is etched under condition of a gas comprising $CF_4$, Argon, $O_2$, $N_2$, or $CHF_3$, between a temperature range of from about 50° C. to about 150° C., applying a power of from about 800 W to about 1,000 W, and for a time from about 40 seconds to 1 minute.

11. The method of claim 1, wherein reflowing the solder material encapsulates the conductive layer.

* * * * *